United States Patent [19]

Hughes

[11] 4,315,166
[45] Feb. 9, 1982

[54] FREQUENCY DIVIDER ARRANGEMENT

[75] Inventor: John B. Hughes, Brighton, England

[73] Assignee: U.S. Philips Corporation, New York, N.Y.

[21] Appl. No.: 113,843

[22] Filed: Jan. 21, 1980

[30] Foreign Application Priority Data

Jan. 31, 1979 [GB] United Kingdom ............. 03449/79

[51] Int. Cl.³ .......................................... H03K 21/36
[52] U.S. Cl. ................. 307/225 R; 328/37; 328/46; 364/703
[58] Field of Search ............ 307/220 R, 225 R, 303, 307/271; 328/46, 48, 37; 364/703

[56] References Cited

U.S. PATENT DOCUMENTS

| | | | |
|---|---|---|---|
| 3,375,449 | 3/1968 | Ribour et al. | 328/48 |
| 3,460,129 | 8/1969 | Thorvaldsson | 364/703 |
| 3,818,354 | 6/1974 | Tomisawa et al. | 307/225 R |
| 3,970,941 | 7/1976 | Leuschner | 328/46 X |
| 4,234,849 | 11/1980 | Crilly | 328/46 |

Primary Examiner—John S. Heyman

Attorney, Agent, or Firm—Thomas A. Briody; Robert T. Mayer; James J. Cannon, Jr.

[57] ABSTRACT

A high frequency divider arrangement for use in transmission systems operating in the gigabit/second range. Known divider arrangements based on ECL logic families have an upper frequency limit which is too low for dividing signals in the gigabit/second range. In one embodiment the inputs of a high frequency multiplexer are connected respectively to the stages of a feedback shift register which produces a sequence of five code words which are serialized by a multiplexer. The bits in the serialized code words occur in blocks which define a mark/space ratio of the output signal which has a frequency of 2/5ths of the clock frequency applied to the multiplexer. By means of additional circuitry, for example D-type flip-flops, the output from the multiplexer can be divided further. The code word(s) applied to the multiplexer can be held static, changed each time the inputs of the multiplexer have been scanned, or held temporarily static for a predetermined number of scans and then changed.

4 Claims, 13 Drawing Figures (a) CL (b) 82    1 1 0 0 1 1 0 0 1 1 0 0

(c) 82

(d) 84

FREQUENCY DIVIDER ARRANGEMENT

BACKGROUND OF THE INVENTION

The invention relates to a device for dividing a pulse series by a predetermined factor, said device comprising input register means for storing a code word for controlling said predetermined factor, said input register means having a first input and furthermore a plurality of first outputs each for a bivalent signal, said device furthermore comprising a primary dividing means for dividing said pulse series by an integer, having second outputs for producing cycles of mutually time-shifted driving pulses thereon, said device furthermore comprising a multiplexing circuit having a plurality of second inputs each connected to a respective one of said first outputs and third inputs for receiving a second plurality of said driving pulses for gating each time a code bit to a common third output.

A circuit of this kind is known from U.S. Pat. No. 3,460,129. The known divider uses D-type flipflops and a multiplicity of interconnections making it useful only to relatively low operating frequencies. Typical upper limits for even the fastest logic ECL families are determined by switching speed limitations in the 500 Megabit/second range. Such a typical upper switching speed while satisfactory for use in systems for multiplexing signals on a coaxial cable which has a typical upper frequency limit of 560 Megabits/second, is of no avail when working at higher bit rates in optical fiber systems.

SUMMARY OF THE INVENTION

It is an object of the invention to provide a divider circuit arrangement which is able to operate at speeds which are greater than known ECL circuits and be of a type of construction that a variety of dividing ratios can be realized, and, notably dividing ratios which are greater than two. The object of the invention is realized in that said input register means comprise a first feedback shift register having a clock input and in that said primary dividing means comprise a cycle of $2n+2$ ($n=1, 2, \ldots$) semiconductor devices in an integrated circuit, said semiconductor devices being cyclically interconnected for controlling a first succession thereof within said cycle to a conducting state and a second succession thereof within said cycle to a non-conducting state and for controlling each time a mutually opposite pair of transitions of two of said semiconductor devices between said first and second successions as determined by a switching delay of at least one such semiconductor device for driving said first and second successions in steady progress along said cycle. In this way, the multiplexed signal at the common output comprises a succession of blocks of bits, which blocks define the output pulse series of the divider device. The shift register may be indexed or clocked after each scan of the multiplexer inputs or after a predetermined number of scans of the multiplexer inputs. In the latter case the predetermined number may be determined by another shift register. Thus, advantageously a second feedback shift register is provided for indexing the first feedback shift register after a code word therein has been multiplexed a predetermined number of times, and in that said primary dividing means is adapted to produce a secondary pulse series, as a sub-multiple of the pulse series received, on a third output, which is connected to a clock input of said second feedback shift register, a register stage output of the latter being connected to a clock input of the first feedback shift register. A divider element may be connected between the pulse series source and the input of the primary dividing means coupled thereto, so that the repetition of the sub-multiple thereof will be lower.

BRIEF DESCRIPTION OF THE FIGURES

The present invention will now be explained and described by way of example, with reference to the accompanying drawings, wherein.

DESCRIPTION OF THE PREFERRED EMBODIMENT

Figure 1:
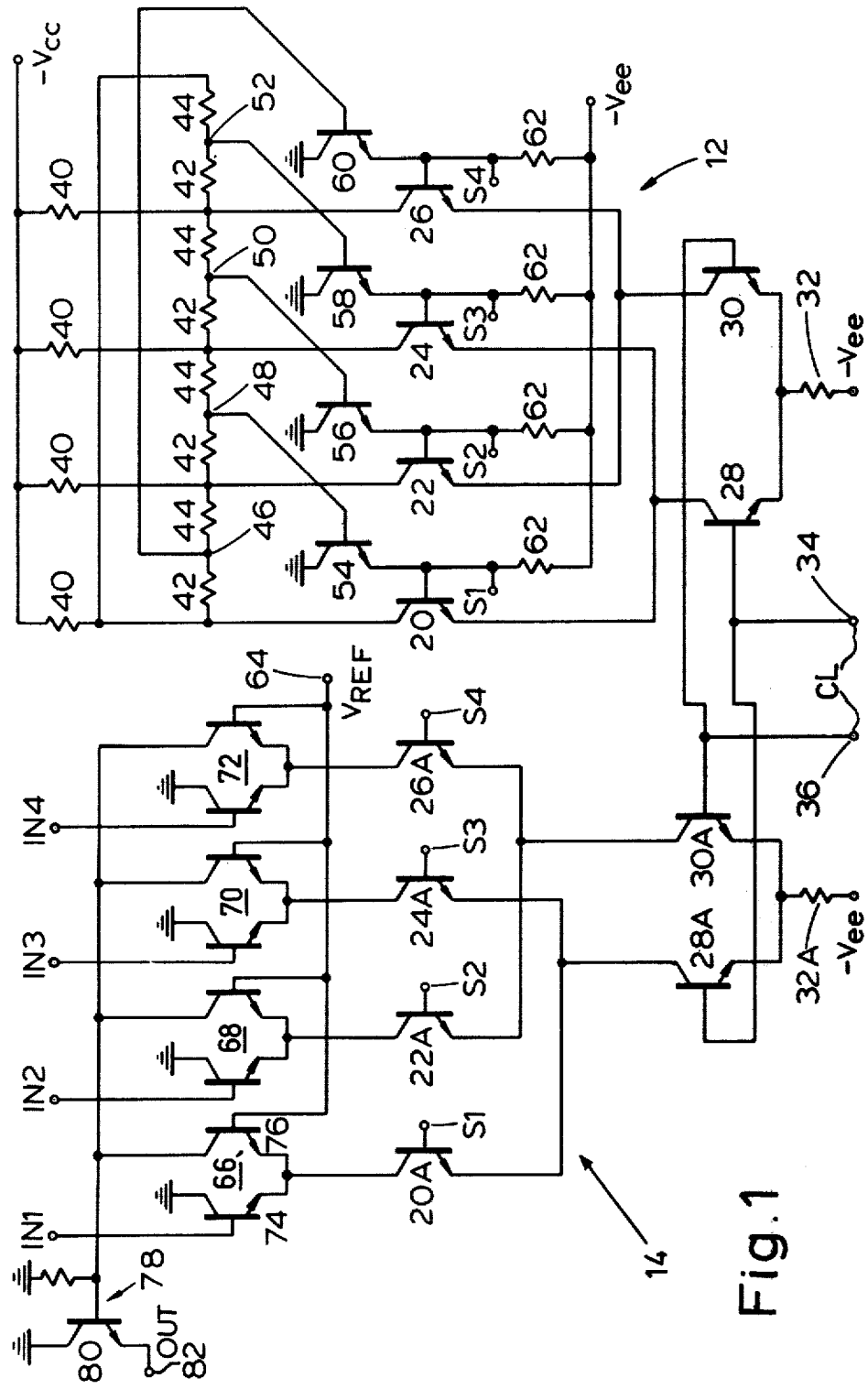
FIG. 1 is a schematic circuit diagram of a multiplexing circuit suitable for use with the divider arrangement in accordance with the present invention.

FIG. 1 shows a schematic circuit diagram of a multiplexing circuit suitable for use with the dividing device according to the invention. The circuit uses a series gating technique.

The circuit may be considered as comprising two parts, one part 12 based on transistors 20 through 26 which produces non-overlapping timing pulses of duration T at respective outputs S1 to S4 and a second part 14 comprising ECL (emitter coupled logic) gates 66 to 72 whose outputs are connected in parallel to an output stage 78 including an emitter follower transistor 80 connected to an output terminal 82 on which the multiplexed output appears.

Part 12 in isolation has been disclosed in the U.S. Pat. No. 4,123,672 of Oct. 31, 1978, herein incorporated by reference. This part comprises four NPN transistors 20, 22, 24 and 26 which are connected together so that the transistors 20 and 24 constitute a first group and the transistors 22 and 26 constitute a second group. A first switching transistor 28 is connected to the emitters of the first group and a second switching transistor 30 is connected to the emitters of the second group. The emitters of the transistors 28 and 30 are connected together and, via a resistance 32, to a bias voltage line −Vee. Antiphase outputs of a clock frequency source (not shown) having a period 2 τ are connected to terminals 34, 36 which are connected to respective bases of the transistors 28 and 30.

The collectors of the transistors 20, 22, 24 and 26 are each connected by way of series connected resistances 40 to a power supply line which in the illustrated embodiment is at −VCC. Pairs of series connected resistances 42, 44 are connected between the junctions of the resistances 40 and collectors of the adjacent transistors 20, 22, 24 and 26. The pairs of resistances 42, 44, each pair of which may be regarded as a tapped resistance, are connected to form a ring. The junctions of the resistances 42, 44 between the transistors 20 and 22, 22 and 24, 24 and 26 and 26 and 20 are referenced 46, 48, 50 and 52, respectively.

The base of the transistor 20 is connected to the junction 48 by means of an emitter follower transistor 54. In a similar way emitter follower transistors 56, 58 and 60 are used to connect the junctions 50, 52 and 46 to the bases of the transistors 22, 24, 26, respectively. Resistors 62 connect each base of the transistors 20, 22, 24 and 26 to a power supply rail at −Vee volts. Timing signals S1 to S4 are derived from the base circuits of the transistors 20 to 26. In similar way a cycle of six or eight transistors may be provided.

Each of the gates 66 through 72 comprises a pair of emitter coupled transistors of which only transistors 74, 76 have been identified. Cyclic timing pulses are applied to the common emitters of these transistor pairs. An input signal IN1 is applied to the base electrode of transistor 74 and correspondingly are applied input signals IN2, IN3, IN4. A reference voltage 64 is connected to the base electrodes of the transistors corresponding to transistor 76, the collectors thereof being each time connected to an output stage 78.

The cyclic timing pulses S1 through S4 are applied as shown to the common emitters of transistors 74, 76 and corresponding further transistor pairs by transistors 20A, 22A, 24A and 26A which duplicate the transistors 20, 22, 24 and 26. The emitters of the transistors 20A and 24A are connected together to form a third group of transistors and the emitters of the transistors 22A and 26A are connected together to form a fourth group of transistors. A third switching transistor 28A has its base connected to the clock signal terminal 34 and therefore is switched in the same phase of the clock signal as the transistor 28 and its collector connected to the emitters of the third group of transistors. A fourth switching transistor 30A has its base connected to the clock signal terminal 36 and its collector connected to the emitters of the fourth group of transistors. The emitters of the transistors 28A and 30A are connected to −Vee via a resistor 32A.

In operation of the circuit of FIG. 1 clock signals having a period 2 τ are applied via the terminals 34, 36 to the base electrodes of the transistors 28, 30. The transistors 20, 22, 24 and 26 are rendered conductive cyclically, each for a period τ corresponding to half the period of the clock signal. The detailed cyclical operation is given in the United States Patent cited hereabove. The base circuits of each transistor 20, 22, 24 and 26 is high for a period τ and low for a period 3 τ and that each high is staggered in time from its direct neighbors by an interval τ.

The collector currents of each of the transistors 20-26, when conductive, are clearly defined. Not all of the current flows into its associated own load resistance 40 because of the coupling resistors 42, 44 and other load resistors 40. The left hand side of FIG. 1 mimics the transistors 20 to 26 so that the collector currents of the transistors 20A to 26A, when conductive, are substantially identical to the collector currents of the transistors 20 to 26. Hence the cyclically switched currents in both halves are the same and are available to enable the associated gate. In this embodiment the rate of gating is determined solely by the frequency of the clock source.

Because each gate 66 to 72 is operated on a respective half cycle of the clock signal then it is able to multiplex information present on the inputs IN1 to IN4 at twice the clock frequency, thus for example if the clock frequency is 500 MHz, the rate of multiplexing is 1 Gbits/sec. As each gate 66 to 72 is switched at a frequency of 250 MHz this is well within the reliable operating frequency range of an ECL gate. If it is desired to provide a second clock frequency of half that as applied to the terminals 34, 36 then this can be derived using the timing signals S1 and S3.

Figure 2:
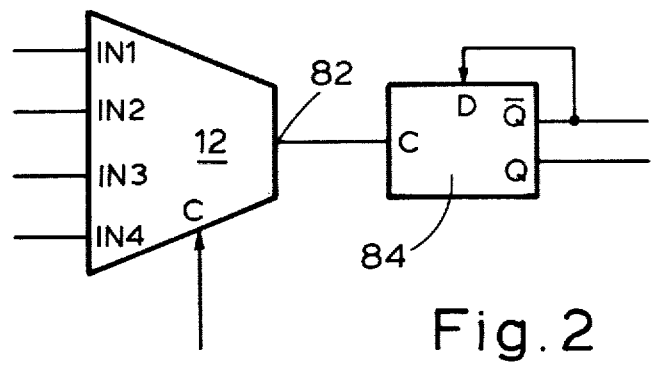
FIG. 2 is block schematic circuit diagram of the multiplexer circuit as shown in FIG. 1 connected to a bistable circuit (flip-flop)

FIG. 2 shows one way in which the multiplexing circuit of FIG. 1 can be used as a divide by 2 circuit. Additionally by connecting a D-type flip-flop circuit 84 to its output, an additional divide by 2 function is obtained.

Figure 3:
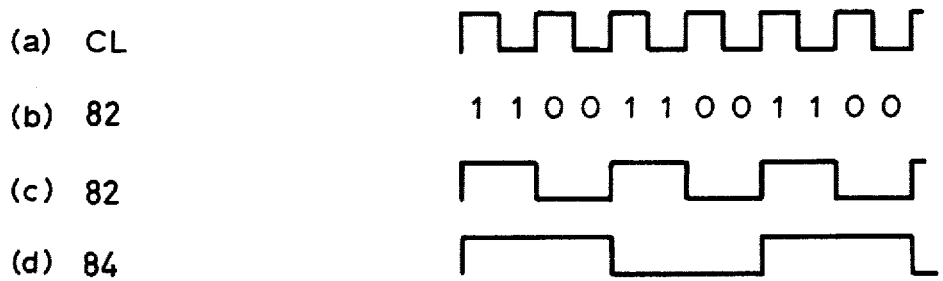
FIG. 3 shows various waveforms occurring at points in the circuit of FIG. 2 when the input code to the multiplexing circuit is static.

The initial divide by 2 function is obtained by applying a static word 1100 to the inputs IN1 to IN4. When a clock signal, say 500 MHz, is applied, the inputs are multiplexed at twice this frequency, see FIG. 3(a). The serialized signal at the output 82 of the multiplexer 12 is a succession of blocks of "1"s and "0"s (FIG. 3 (b)), the frequency of the blocks is half the clock frequency (FIG. 3(c)), namely 250 MHz. When the output of the multiplexer 12 is applied to the D-type flip-flop 84, the frequency is halved again (FIG. 3(d)).

Various other dividing ratios can be attained provided that the code words applied to the inputs to the multiplexer 12 can be presented in a desired sequence of blocks of "1"s and "0"s. One way of doing this is shown block schematically in FIG. 4 wherein a feedback shift register 86 is connected to the inputs of the multiplexer 12. The clock frequency F2 applied to the shift register 86 will be lower than the clock frequency F1 applied to the multiplexer because once the shift register 86 has been indexed it must remain static until the inputs IN1 to IN4 of the multiplexer 12 have been scanned one or more times. In the case of a 4 input multiplexer 12 the clock frequency F1 will be at least twice the clock frequency F2. This means that for a multiplexer 12 operating at 2 Gigabits/second, its clock frequency F1 will be 1 GHz and the clock frequency F2 will be no greater than 500 MHz. Accordingly the feedback shift register 86 can be constructed using conventional ECL techniques.

Figures 4, 5:
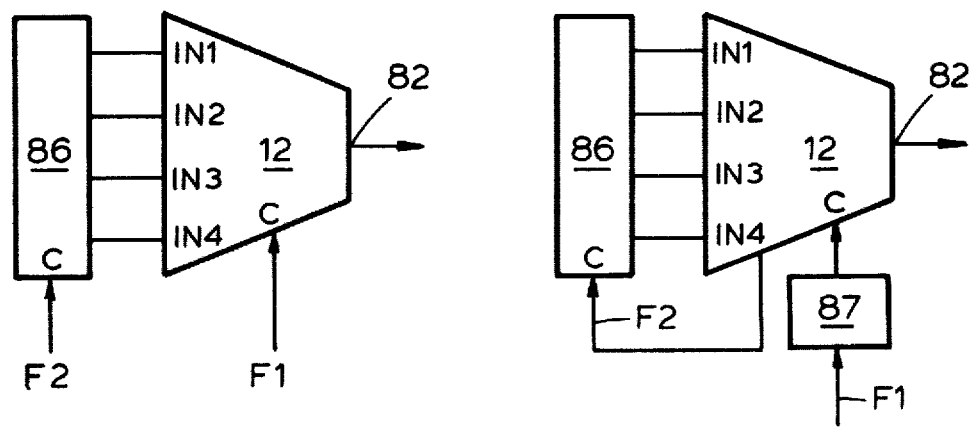
FIG. 4 is a block schematic diagram of an embodiment of the invention in which the input code to the multiplexing circuit is changed sequentially using a feedback shift register.
FIG. 5 is a modification of FIG. 4 and illustrates the feedback shift register deriving its clock frequency from the multiplexer, the clock signal to which is divided down before being applied to its input.

FIG. 5 is a modification of FIG. 4 in that the clock signal F2 for the feedback shift register 86 is derived from the multiplexer 12 and that the clock frequency to the multiplexer 12 is divided, for example by 2, in a special purpose divider element 87 before being applied to the clock input of the multiplexer 12. By providing the divider element 87, the maximum speed at which the overall circuit can be operated is at least doubled. Although not shown an additional divider, for example the D-type flip-flop 84 may be connected to the output 82 of the multiplexer 12 thereby increasing the dividing ratio. The use of a single clock source enables the multiplexer 12 and the feedback shift register 86 to be synchronized, if necessary with the provision of compensating delay elements, more easily than with separate clock frequency sources.

Figure 6:
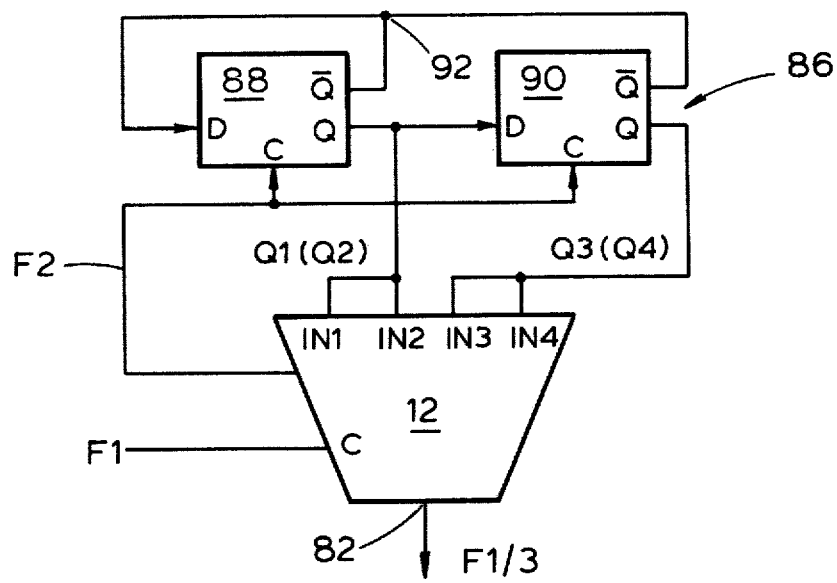
FIG. 6 is a block schematic diagram of a divide by 3 circuit.

FIG. 6 illustrates schematically a divide by 3 circuit-arrangement. The shift register 86 comprises two D-type flip-flops 88, 90. The Q output of the D-type flip-flop 88 is connected to the D input of the flip-flop 90 and to the parallel connected inputs IN1 and IN2 of the multiplexer 12. The $\overline{Q}$ output of the D-type flip-flop 90 is connected to the inputs IN3 and IN4 of the multiplexer 12. The Q outputs of these D-type flip-flops are connected to an OR circuit represented by a junction 92 which is connected to the D-input of the D-type flip-flop 88. In designing the feedback shift register 86 regard had to be paid to the fact that when multiplexing the inputs IN1 to IN4 the serialized output at 82 is a succession of blocks of "1"s and "0"s. Over 3 cycles of the clock frequency F2 which is half the clock frequency F1, the shift register 86 produces 3 different code words before reverting to the first one, that is

| Code Word | Q1 | (Q2) | Q3 | (Q4) |
|---|---|---|---|---|
| 1 | 0 | 0 | 1 | 1 |
| 2 | 1 | 1 | 0 | 0 |
| 3 | 1 | 1 | 1 | 1 |
| 1 | 0 | 0 | 1 | 1 |

Figure 7:
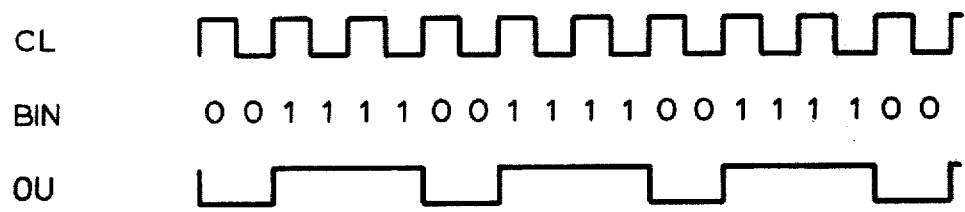
FIG. 7 shows the waveforms occurring at various points in the circuit of FIG. 6.

When the code words 1 to 3 are serialized the signal at the output 82 is 0011 1100 1111 from which it will be noted that there are two blocks of "1"s and two blocks of "0"s which represent two cycles of a pulse repetition frequency which is one third of the clock frequency F1. FIG. 7 shows, respectively: the clock waveform CL, the binary output BIN, and the output waveform OU. The dividing ratio can again be made into 6:1 corresponding to FIG. 2.

Figure 8:
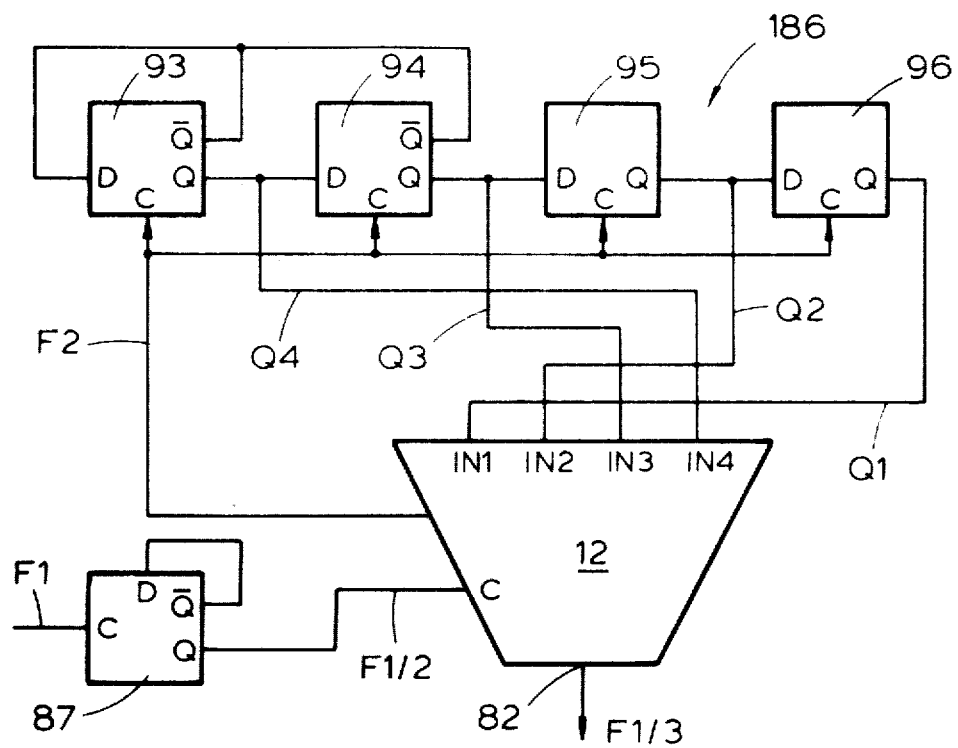
FIG. 8 is a block schematic diagram of another divide by 3 circuit.

FIG. 8 shows another divide by three circuit arrangement in which the outputs Q1, Q2, Q3, Q4 of a feedback shift register 186 are connected to the inputs IN1 to IN4 of the multiplexer 12. The clock frequency F1 is divided by 2 in a D-type flip-flop 87 before being applied as F$\frac{1}{2}$ to the clock input C of the multiplexer 12.

The shift register 186 comprises four D-type flip-flops 93 to 96. The $\overline{Q}$ outputs of the flip-flops 93 to 95 are connected to the D inputs of the flip-flops 94 to 96. The Q outputs of the flip-flops 93, 94 are connected as a feedback loop to the D-input of the flip-flop 93. The clock inputs C of the flip-flops 93 to 96 are supplied with a frequency F2, which is equal to F$\frac{1}{2}$, by the multiplexer 12. Unlike the previous and subsequent embodiment of the invention, it should be noted that the Q outputs of the flip-flops 93 to 96 are connected to the inputs IN1 to IN4 of the multiplexer in reverse order, that is Q1 is the output of the last stage, flip-flop 96, of the feedback shift register while Q4 is the output of the first stage, and so on.

With the described arrangement of the feedback shift register 186, a cycle of three different code words are produced, that is

| Code Word | Q1 | Q2 | Q3 | Q4 |
|---|---|---|---|---|
| 1 | 1 | 1 | 0 | 1 |
| 2 | 1 | 0 | 1 | 1 |
| 3 | 0 | 1 | 1 | 0 |
| 1 | 1 | 0 | 1 | 1 |

Figure 9:
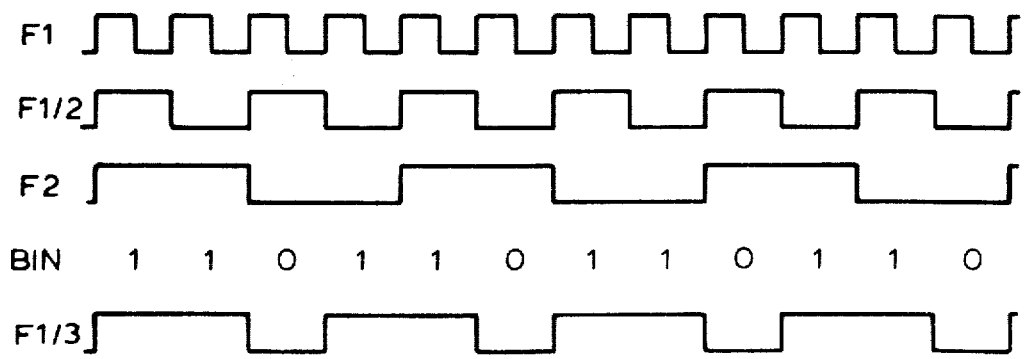
FIG. 9 shows the waveforms occurring at various points in the circuit of FIG. 8.

When these code words are serialized, the signal at the output 82 of the multiplexer comprises 1101 1011 0110 which corresponds to a pulse repetition frequency of $\frac{1}{3}$rd of the clock frequency F1. As shown in FIG. 9 the clock frequency F1 is initially divided by 2 in the flip-flop 87 to form a signal F$\frac{1}{2}$ which is effectively divided by $\frac{2}{3}$ in the combination of the feedback shift register 186 and the multiplexer 12 to form an output signal F$\frac{1}{3}$ at the output 82. Initial tests on this divider circuit arrangement indicates that it works satisfactorily at a clock frequency F1 of 1.8 GHz which is much higher than is possible with present-day ECL logic circuitry.

Figure 10:
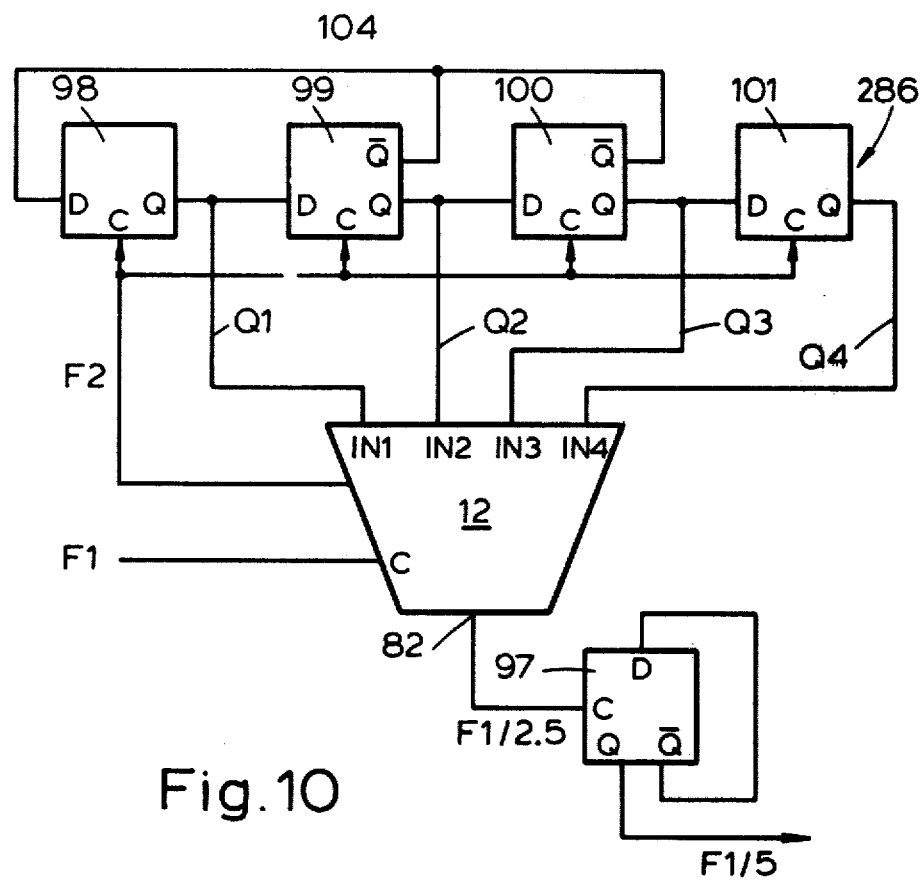
FIG. 10 is a block schematic diagram of a divide by $2\frac{1}{2}$ and divide by 5 circuit.

FIG. 10 shows schematically a divider arrangement which has an initial dividing ratio of 2.5:1 which is made into 5:1 by connecting a flip-flop, in this case a D-type flip-flop 97, to the output 82 of the multiplexer 12.

The feedback shift register 286 comprises four D-type flip-flops 98 to 101. The Q-outputs of these flip-flops are connected to respective inputs IN1 to IN4 of the multiplexer 12 and in the case of the flip-flops 98, 99 and 100, their Q-outputs are also connected to the data or D-input of the adjacent flip-flop 99, 100 and 101. The $\overline{Q}$ outputs of the flip-flops 99 and 100 are connected to an OR circuit formed in this embodiment by a junction 104 which is connected to the D input of the flip-flop 98. When a clock frequency F2, which is half the frequency F1, is applied to the shift register 286, the code words produced repeat after 5 cycles, thus

| Code Word | Q1 | Q2 | Q3 | Q4 |
|---|---|---|---|---|
| 1 | 0 | 0 | 1 | 1 |
| 2 | 1 | 0 | 0 | 1 |
| 3 | 1 | 1 | 0 | 0 |
| 4 | 1 | 1 | 1 | 0 |
| 5 | 0 | 1 | 1 | 1 |
| 1 | 0 | 0 | 1 | 1 |

Figure 11:
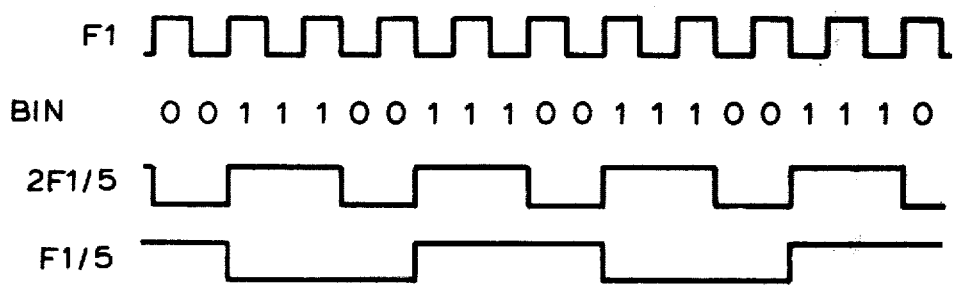
FIG. 11 shows the waveforms at various points in the circuit of FIG. 10.

By serializing the code words 1 to 5 the digital signal at the output 82 comprises 0011 1001 1100 1110 0111 which corresponds to a pulse repetition frequency of 2/5ths of the clock frequency F1. This frequency 2F1/5 is divided by two in the flip-flop 907. FIG. 11 shows the input frequency F1, the serialized code words BIN, and the waveforms on the outputs of elements 12 and 97, respectively.

If desired the circuit of FIG. 10 can be re-arranged so that the D-type flip-flop 97 is connected to the clock frequency input C of the multiplexer 12 thereby dividing the frequency F1 by 2. Consequently the frequency F2 is equal to F$\frac{1}{4}$. By providing flip-flops connected to both the clock input C and the output 82 of the multiplexer 12, the overall dividing ratio will be 10 to 1.

By comparing the cycles of the code words obtained with the feedback shift registers shown in FIGS. 6 and 8 with the serialized signal at the multiplexer output 82 and by making a similar comparison in the case of the feedback shift register of FIG. 10 it will be noted that not only do the rows or code words when serialized indicate the mark/space ratio of the signal at the output 82 but also each column, for example, Q1, provides this indication as well. Hence it is concluded that only feedback shift registers having this row/column feature are suitable for a divider arrangement in which the shift register is clocked or stepped each time after the multiplexer has multiplexed the inputs IN1 to IN4 once.

Figure 12:
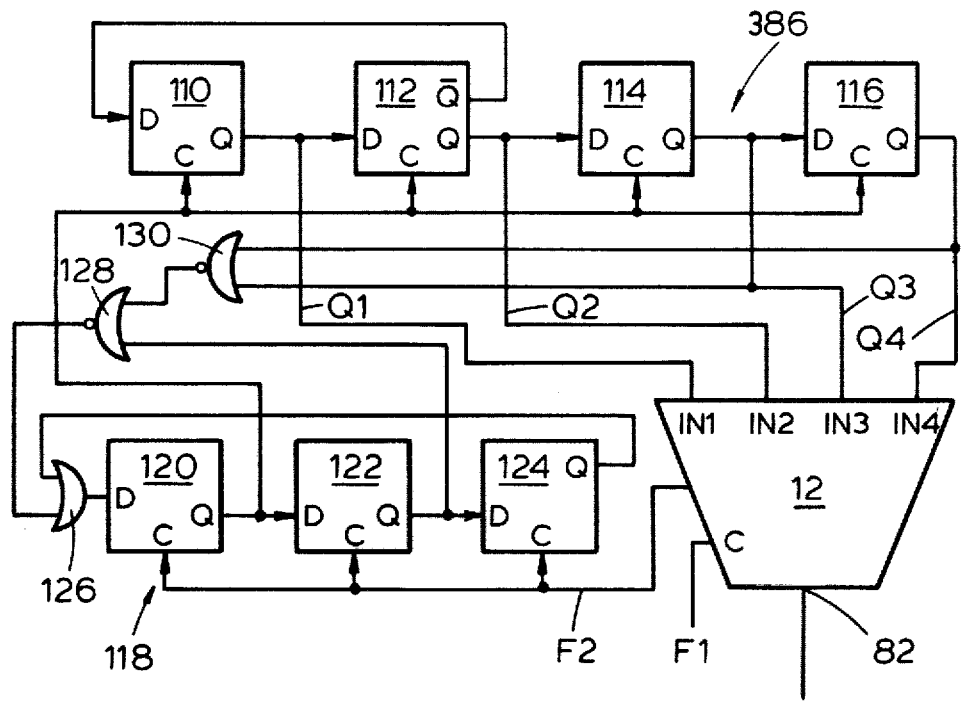
FIG. 12 is a block schematic diagram of another embodiment of a divider circuit in which the frequency shift register is indexed in a preprogrammed manner.

In certain practical applications such as redundancy coding, it is desired to provide a dividing ratio, which will remove the redundancy bit when demultiplexing for example a 20B/21B code. A 20/21 divider arrangement is shown in FIG. 12.

This circuit comprises a four stage divide by four feedback shift register 386 and the multiplexer 12 with its inputs IN1 to IN4 connected respectively to the outputs of the four stages. The stages of the shift register 386 are formed D-type flip-flops 110, 112, 114 and 116. The Q outputs of the flip-flops 110 to 116 are connected to the respective inputs IN1 to IN4 of the multiplexer 12 and in the case of the flip-flops 110, 112 and 114, to the D input of the next following flip-flop. The Q output of the flip-flop 112 is connected to the D input of the flip-flop 110. The shift register 386 produces a cycle of four code words which are:

| Code Word | Q1 | Q2 | Q3 | Q4 |
|---|---|---|---|---|
| 1 | 0 | 1 | 1 | 0 |
| 2 | 0 | 0 | 1 | 1 |
| 3 | 1 | 0 | 0 | 1 |
| 4 | 1 | 1 | 0 | 0 |
| 1 | 0 | 1 | 1 | 0 |

Figure 13:
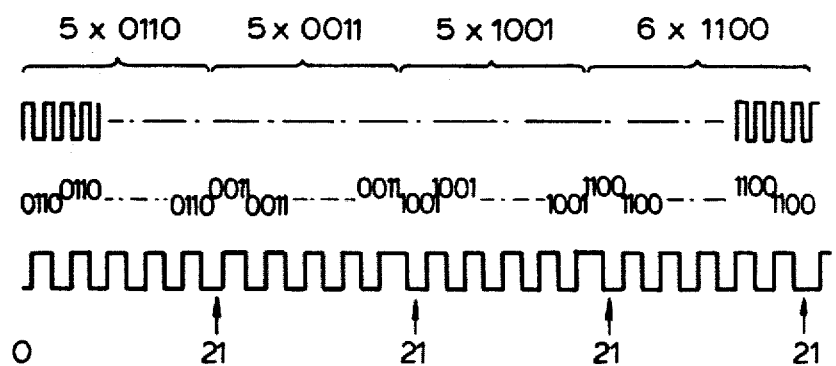
FIG. 13 shows the various waveforms occurring in FIG. 12.

If the shift register 386 is left on any one of these code words, the waveform at the output 82 of the multiplexer 12 has a 50/50 duty cycle. However serializing from one code word to the next code word introduces either an extra "1" or "0". This feature can be used to remove the 21st bit during demultiplexing. This operation can be done by scanning 5 times in succession the code words 1, 2 and 3 and scanning code word "4" for 6 times. FIG. 13 in this respect shows the successive code words, in combination with the number of times they are scanned (5 or 6), the clock frequency, the serialized code words, and the output waveform, respectively. It will be noted that over 42 cycles (or 84 bit periods) of the clock frequency F1 there are two marks of three bit periods and two spaces of three bit periods. Furthermore it will be noted that the redundancy (21st) bit always occurs at a space and hence does not appear in the output of the demultiplexer.

FIG. 12 also includes a sub-circuit whereby the code words 1, 2 and 3 can be scanned five times in succession and the code word 4 can be scanned six times in succession. Essentially this sub-circuit comprises a modified divide by 5 feedback shift register circuit 118 comprising three D-type flip-flops 120, 122 and 124. The D inputs of the gates 122 and 124 are connected to the Q outputs of the preceding flip-flops. While the D input of the flip-flop 120 is connected to the Q̄ output of the flip-flop 124 via an OR gate 126. The Q output of the flip-flop 122 is connected to a second input of the OR gate 126 via a NOR gate 128. The clock inputs of the flip-flops 120, 122 and 124 are connected to receive the frequency F2 from the multiplexer 12. The clock input for the feedback shift register 386 is derived from the Q output of the flip-flop 120. Thus every time this output changes from "0" to "1" the feedback shift register 386 is clocked. With the circuit so far described, a cycle of five code words is produced and these produce the divide by 5 function. However in order to produce a divide by 6 function at the correct instant the feedback shift register 118 is modified by the provision of a NOR gate 130 having two inputs connected respectively to the Q outputs of the flip-flops 114 and 116 and an output connected to a second input of the NOR gate 128.

The operation of the feedback shift register 118 will now be described. In the divide by five mode, when the Q outputs of the flip-flops 114 and 116 are not both zero, the shift register 118 produces the following code words

| Code Word | Q1 | Q2 | Q3 |
|---|---|---|---|
| 1 | 1 | 1 | 0 |
| 2 | 1 | 1 | 1 |
| 3 | 0 | 1 | 1 |
| 4 | 0 | 0 | 1 |
| 5 | 1 | 0 | 0 |
| 1 | 1 | 1 | 0 |

By examining the column Q1, the output of the flip-flop 120, it will be noticed that there is only one change from "0" to "1". The divide by five function is repeated for 3 cycles until the code word produced by the feedback shift register 386 is 1100, the output from the NOR gate 130 changes to a "1" and this has the effect of changing the feedback shift register 118 to a divide by 6 register having the following code words.

| Code Word | Q1 | Q2 | Q3 |
|---|---|---|---|
| 1 | 1 | 1 | 0 |
| 2 | 1 | 1 | 1 |
| 3 | 0 | 1 | 1 |
| 4 | 0 | 0 | 1 |
| 5 | 0 | 0 | 0 |
| 6 | 1 | 0 | 0 |
| 1 | 1 | 1 | 0 |

A comparison between the divide by 5 and divide by 6 sequences of code words shows that the latter matrix includes a code word represented by 000. Once again there is only one change from 0 to 1 and hence the feedback shift register 386 is only clocked four times during 84 clock pulse periods.

What is claimed is:

1. A device for dividing a pulse series by a predetermined factor, said device comprising input register means for storing a code word for controlling said predetermined factor, said input register means having a first input and furthermore a plurality of first outputs each for a bivalent signal, said device furthermore comprising a primary dividing means for dividing said pulse series by an integer, having second outputs for producing cycles of mutually time-shifted driving pulses thereon, said device furthermore comprising a multiplexing circuit having a plurality of second inputs each connected to a respective one of said first outputs and third inputs for receiving a second plurality of said driving pulses for gating each time a code bit to a common third output, characterized in that said input register means comprise a first feedback shift register having a clock input and in that said primary dividing means comprise a cycle of $2n+2(n=1,2,\ldots)$ semiconductor devices in an integrated circuit, said devices being cyclically interconnected for controlling a first succession thereof within said cycle to a conducting state and a second succession within said cycle to a non-conducting state and for controlling each time a mutually opposite pair of transitions of two of said semiconductor devices between said first and second successions as determined by a switching delay of at least one such semiconductor device for driving said first and second successions in steady progress along said cycle.

2. A device as claimed in claim 1, characterized in that said primary dividing means is adapted to produce a secondary pulse series, as a sub-multiple of the pulse series received, or a third output which is connected to a clock input of said first feedback shift register.

3. A device as claimed in claim 1, characterized in that a second feedback shift register is provided for indexing the first shift register after a code word therein has been multiplexed a predetermined number of times, and in that said primary dividing means is adapted to produce a secondary pulse series, as a sub-multiple of the pulse series received, on a third output, which is connected to a clock input of said second feedback shift register, a register stage output of the latter being connected to a clock input of the first feedback shift register.

4. A device as claimed in claim 1, 2 or 3, characterized in that said first feedback shift register comprises at least two ECL stages.

* * * * *